United States Patent
Uchinono et al.

(10) Patent No.: US 6,833,511 B2
(45) Date of Patent: Dec. 21, 2004

(54) MULTILAYER CIRCUIT BOARD AND METHOD OF MANUFACTURING THE SAME

(75) Inventors: Yoshiyuki Uchinono, Hirakata (JP); Kazuo Sawada, Katano (JP); Yasufumi Masaki, Hirakata (JP); Masahide Muto, Kobe (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/995,085

(22) Filed: Nov. 27, 2001

(65) Prior Publication Data

US 2002/0062987 A1 May 30, 2002

(30) Foreign Application Priority Data

| Nov. 27, 2000 | (JP) | ........................................ 2000-360220 |
| Dec. 1, 2000 | (JP) | ........................................ 2000-367091 |

(51) Int. Cl.[7] ............................................... H05K 1/03
(52) U.S. Cl. ........................ 174/255; 174/258; 361/795
(58) Field of Search ................................. 174/250–260, 174/261; 361/792–795, 749, 777; 29/846–847, 25.35, 620; 156/656; 428/626

(56) References Cited

U.S. PATENT DOCUMENTS

| 3,349,162 A | | 10/1967 | Eckhardt et al. ............ 174/68.5 |
| 4,963,697 A | | 10/1990 | Peterson et al. ............. 174/252 |
| 5,080,455 A | * | 1/1992 | King et al. ................... 359/350 |
| 5,164,332 A | * | 11/1992 | Kumar ........................ 438/653 |
| 5,584,120 A | * | 12/1996 | Roberts ....................... 156/154 |
| 5,640,760 A | | 6/1997 | Val et al. ....................... 29/830 |
| 5,657,537 A | | 8/1997 | Saia et al. ..................... 29/830 |
| 5,903,440 A | * | 5/1999 | Blazier et al. ............... 174/254 |
| 5,937,493 A | * | 8/1999 | Nellissen .................... 29/25.35 |
| 5,956,609 A | * | 9/1999 | Lee et al. .................... 438/627 |
| 6,100,178 A | | 8/2000 | Todd et al. .................. 438/622 |

FOREIGN PATENT DOCUMENTS

| EP | 0498258 A1 | 8/1992 | ............ H05K/3/46 |
| GB | 1124564 | 8/1968 | ............ H05K/3/32 |
| JP | 6-152098 | 5/1994 | ............ H05K/3/06 |
| JP | 7-170077 | 7/1995 | |
| JP | 7-249873 | 9/1995 | |
| JP | 9-153661 | 6/1997 | ............ H05K/1/02 |
| JP | 10-282145 | 10/1998 | ............ G01R/1/073 |

OTHER PUBLICATIONS esp@cenet, Publication No. EP0498258, publication date Aug. 12, 1992 (1 page).
European Search Report dated Jan. 15, 2004 (5 pages).
Japanese Patent Abstract No. JP7249873; Published Sep. 26, 1995.
Japanese Patent Abstract No. JP7170077; Published Jul. 4, 1995.

* cited by examiner

Primary Examiner—Kamand Cuneo
Assistant Examiner—Tuan Dinh
(74) Attorney, Agent, or Firm—Osha & May L.L.P.

(57) ABSTRACT

A molded interconnect device (MID) having a multilayer circuit of a reduced thickness, in which a layer-to-layer connection(s) is formed with high reliability, is provided as a multilayer circuit board. The multilayer circuit board comprises a substrate having a first surface and a second surface extending from an end of the first surface at a required angle relative to the first surface, and the multilayer circuit formed on the first surface and composed of a plurality of circuit layers. Each of the circuit layers is provided with a conductive layer having a required circuit pattern and an insulation layer formed on the conductive layer by film formation. The layer-to-layer connection of the multilayer circuit is made through a second conductive layer formed on the second surface of the substrate.

11 Claims, 12 Drawing Sheets

MULTILAYER CIRCUIT BOARD AND METHOD OF MANUFACTURING THE SAME

BACKGROUND OF THE INVENTION

1. Field of the Invention

The present invention relates to a multilayer circuit board, and particularly a molded interconnect device (MID) having a multilayer circuit of a reduced thickness, in which a layer-to-layer connection(s) is formed with high reliability, and a method of manufacturing the same.

2. Disclosure of the Prior Art

In recent years, a molded interconnect device (MID) obtained by three-dimensionally forming circuit patterns on an injection-molded substrate receives attention from the viewpoint of reductions in weight and size of electronic devices, and for the purpose of improving a degree of flexibility in circuit design and achieving high-density wiring.

Figures 19A, 19B:
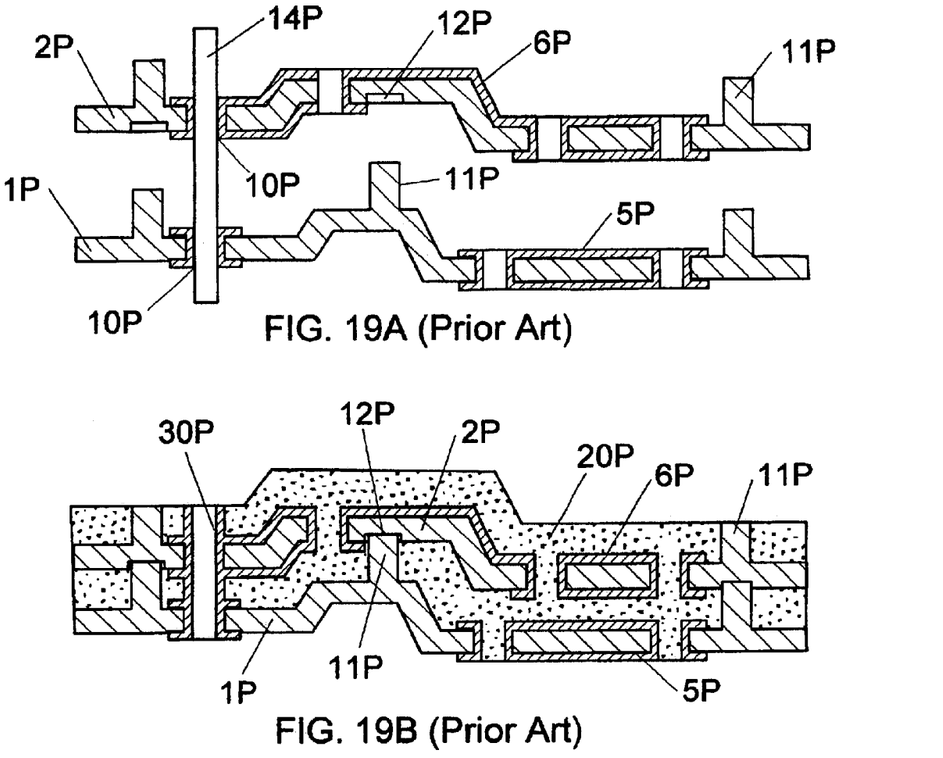
FIGS. 19A and 19B are cross-sectional views showing a method of manufacturing injection-molded circuit parts disclosed in Japanese Patent Early Publication No. 7-170077.

For example, Japanese Patent Early Publication No. 7-170077 discloses a method of manufacturing injection-molded circuit parts. In this method, as shown in FIG. 19A, a plurality of injection-molded circuit members (1P, 2P) are previously produced. Each of the circuit members has conductive circuit patterns (5P, 6P) on its top and bottom surfaces. In addition, each of the circuit members has a positioning hole 10P, spacing projections 11P and recesses 12P for receiving the spacing projections. These circuit members are laminated such that the spacing projection 11P of the circuit member 1P is inserted into the corresponding recess 12P of the adjacent circuit member 2P, to obtain a multilayer circuit structure. Positions of the respective circuit members in the multilayer circuit structure are determined by allowing a positioning pin 14P to pass through the positioning holes 10P.

Then, a clearance between adjacent circuit members (1P, 2P) of the multilayer circuit structure is filled with an insulating resin 20P, and an electrically conductive film 30P is formed in a through-hole obtained by removing the pin 14P from the positioning holes 10P to obtain a layer-to-layer connection in the multilayer circuit structure, as shown in FIG. 19B.

According to this method, it is possible to prevent the occurrence of pinholes or short mold at the clearance between the circuit members (1P, 2P), a break in the conductive circuit pattern (5P, 6P), and a flaking caused between layers, and also provide the multilayer circuit structure having high-density wiring. However, in this method, since the plural injection-molded circuit members are laminated, and the insulating resin is filled in the clearance between the adjacent circuit members (1P, 2P), an increase in thickness of the obtained multilayer circuit structure becomes a problem.

Figure 20A:
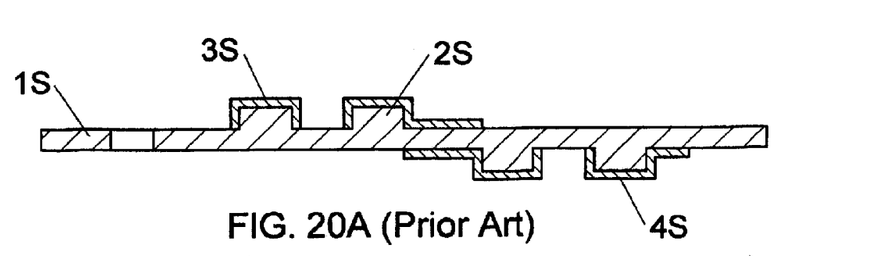
FIGS. 20A and 20B are cross-sectional views showing a method of manufacturing a multilayer circuit molded article disclosed in Japanese Patent Early Publication No. 7-249873.
Figure 20B:
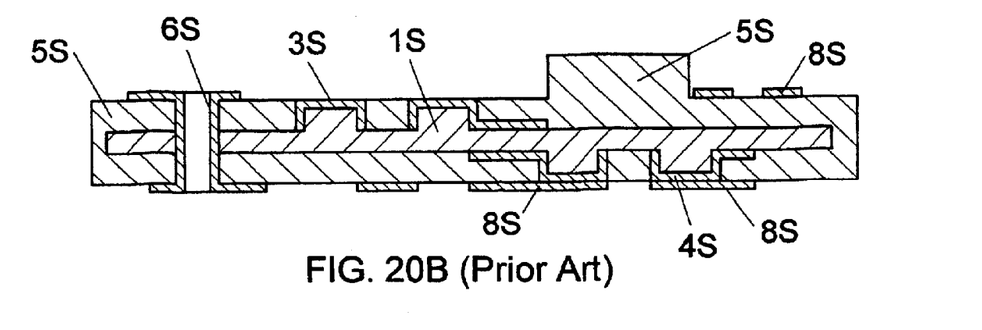

On the other hand, Japanese Patent Early Publication No. 7-249873 discloses a multilayer-circuit molded article and a method of manufacturing the same. In this method, as shown in FIG. 20A, a resin-molded inner substrate 1S having protrusions 2S on its top and bottom surfaces is formed. Then, first circuit patterns (3S, 4S) are formed at required regions on the top and bottom surfaces of the inner substrate 1S by electroless plating. After the inner substrate 1S having the first circuits (3S, 4S) is placed in a mold cavity, a resin-molded outer substrate 5S is formed on the inner substrate 1S by injection molding such that only the first circuit patterns on the top surfaces of the protrusions 2S of the inner substrate 1S are exposed outside, as shown in FIG. 20B. Next, second circuit patterns 8S are formed at required regions on the outer substrate 5S by electroless plating. The second circuit patterns 8S can be connected to the first circuit patterns (3S, 4S) on the protrusions 2S to make a layer-to-layer connection between the inner and outer substrates (1S, 5S). In addition, an electrical connection between the second circuit patterns 8S on the top and bottom surfaces of the outer substrate 5S can be made by a through-hole plating 6S.

In this method, since a plating solution for electroless plating can sufficiently contact the surfaces of the protrusions 2S, there is an advantage that the plating step can be performed with reliability. In addition, it is possible to avoid a situation that flowability of the plating solution decreases as higher levels of integration. These are effective to form the layer-to-layer connection with a high degree of reliability. However, since the inner substrate 1S having the first circuit patterns (3S, 4S) is placed again in the mold cavity, and then the outer substrate 5S is formed around the inner substrate 1S by injection molding, the procedure for forming a multilayer structure of the resin-molded substrates may become complicated. In addition, there is a problem that the thickness of the multilayer structure increases.

Thus, these conventional techniques still have plenty of room for improvement from the viewpoints of achieving a higher integration of the multilayer circuit board and particularly the MID having a multilayer circuit, while maintaining a high degree of reliability of the layer-to-layer connection.

SUMMARY OF THE INVENTION

In view of the above problems, a concern of the present invention is to provide a multilayer circuit board, and particularly a molded interconnect device (MID) having a multilayer circuit of a reduced thickness, in which a layer-to-layer connection(s) is formed with high reliability.

That is, the multilayer circuit board of the present invention comprises:

a substrate having a first surface and a second surface extending from an end of the first surface at a required angle relative to the first surface;

a multilayer circuit formed on the first surface of the substrate and composed of a plurality of circuit layers, each of which is provided with a conductive layer having a required circuit pattern and an insulation layer formed on the conductive layer by means of film formation;

a second conductive layer formed on the second surface of the substrate, by which the layer-to-layer connection of the multilayer circuit is made.

In a preferred embodiment of the present invention, the second surface of the substrate is a side surface of a projection on the first surface. In particular, it is preferred that the substrate has a third surface extending at a different level from the first surface and a fourth surface extending from the other end of the first surface to an end of the third surface, and the multilayer circuit is formed on the first, third and fourth surfaces of the substrate, and the second conductive layer is formed on a side surface of a projection on the first surface to make the layer-to-layer connection of the multilayer circuit. In this case, it is possible to form the layer-to-layer connection(s) of the multilayer circuit on a substrate for MID, for example, a substrate used in a first embodiment of the present invention and having configurations shown in FIG. 1A, with high degrees of reliability and flexibility in circuit design. When the second conductive layer is a plurality of second conductive layers to obtain plural layer-to-layer connections of the multilayer circuit, it is preferred that each of second conductive layers is separated from an adjacent second conductive layer in the thickness direction by a second insulation layer.

In a further preferred embodiment of the present invention, the first surface is a top surface of the substrate, and the second surface is a side surface of the substrate. In addition, it is preferred that the multilayer circuit has an aperture, through which a part of the first surface is exposed, and an electronic device is mounted in a concave formed in the exposed first surface, and an electrical connection between the multilayer circuit and the electronic device is made by a third conductive layer formed on an inner surface of the concave.

Another concern of the present invention is to provide a method of manufacturing the multilayer circuit board described above. That is, the method comprises the steps of: providing a substrate having a first surface and a second surface extending from an end of the first surface at a required angle relative to the first surface;
performing a given number of circuit-layer forming steps to obtain a multilayer circuit on the first surface of the substrate, each of the circuit-layer forming steps including forming a conductive layer having a required pattern and forming an insulation layer on the conductive layer by means of film formation; and
forming a second conductive layer on the second surface of the substrate, by which a layer-to-layer connection of the multilayer circuit is made.

In the above method, it is preferred that the first surface is a top surface of the substrate, and the second surface is a side surface of a projection on the first surface, and wherein the second conductive layer is formed on the side surface of the projection during the circuit-layer forming steps.

In addition, it is preferred that the second conductive layer is obtained by cutting the substrate having the multilayer circuit such that a cutting surface of the multilayer circuit is flush with the cutting surface of the substrate, and forming a conductive film for the layer-to-layer connection on the cutting surfaces of the multilayer circuit and the substrate.

These and still other objects and advantages will become apparent from the following detail description of the invention and preferred embodiments of the invention.

BRIEF EXPLANATION OF THE DRAWINGS

In FIGS. 10A and 10B.

In FIGS. 13A to 13C.

DETAIL DESCRIPTION OF THE INVENTION

Preferred embodiments of the present invention are explained in detail referring to the attached drawings. However, these embodiments do not limit the scope of the present invention.

First Embodiment

A multilayer circuit board of the first embodiment of the present invention can be manufactured by the following method.

Figure 1A:
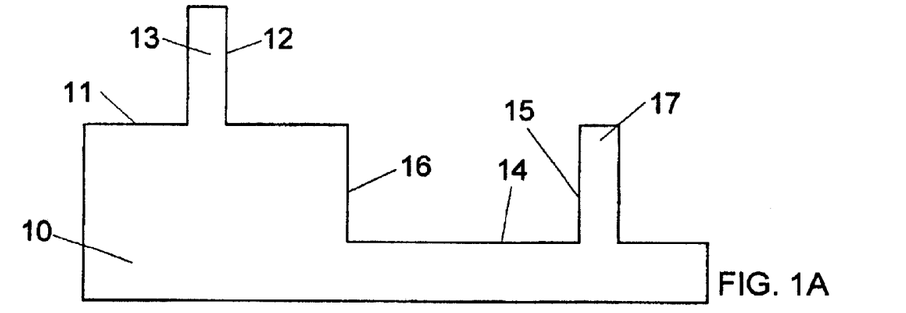
FIGS. 1A to 1D are cross-sectional views illustrating a method of manufacturing a multilayer circuit board according to a first embodiment of the present invention.

First, a resin-molded substrate 10 for MID (molded interconnect device) is prepared. As shown in FIG. 1A, this substrate 10 has, on its top surface, a first surface 11, a first projection 13 on the first surface, second surface 14 extending at a different level from the first surface, second projection 17 on the second surface, and a third surface 16 extending between the first and second surfaces (11, 14) in a substantially vertical direction.

The substrate for MID can be three-dimensionally produced by means of injection molding. As the resin material, for example, it is possible to use polyphenylene sulfide (PPS), liquid-crystal polymer (LCP), syndiotactic polystyrene (SPS), or polyphthal amide (PPA). In addition, a filler such as inorganic fibers may be added into the resin material to improve the mechanical strength of the substrate. Alternatively, a ceramic substrate can be used as the substrate for MID. For example, the ceramic substrate for MID can be produced by injection-molding a ceramic powder such as alumina ($Al_2O_3$) to obtain a molded article having a required three-dimensional shape, and sintering the molded article. In this case, a multilayer circuit board of the present invention can be manufactured by forming a multilayer circuit on the ceramic substrate for MID.

Figure 1B:
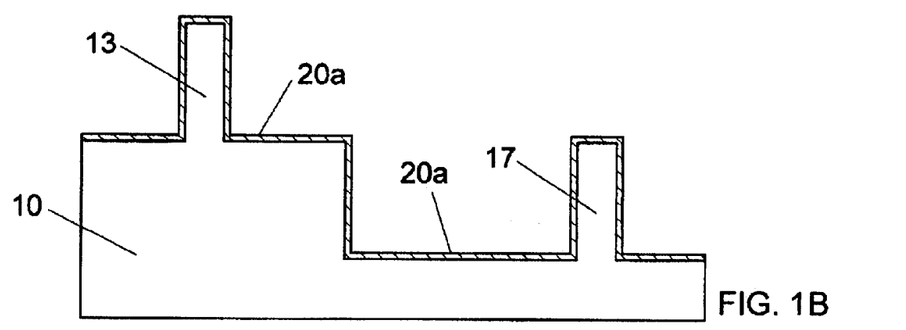
Figure 1C:
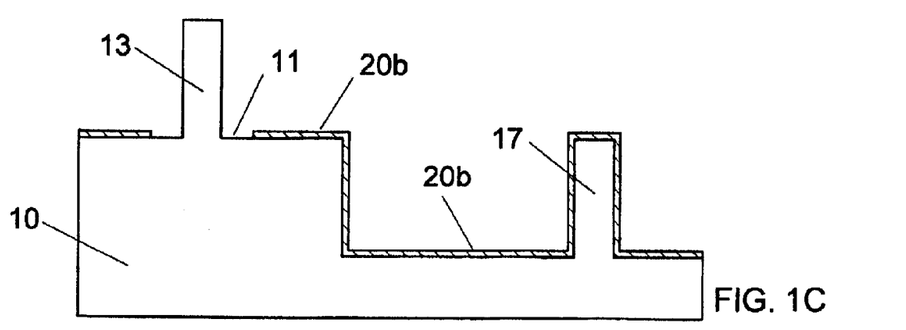
Figure 1D:
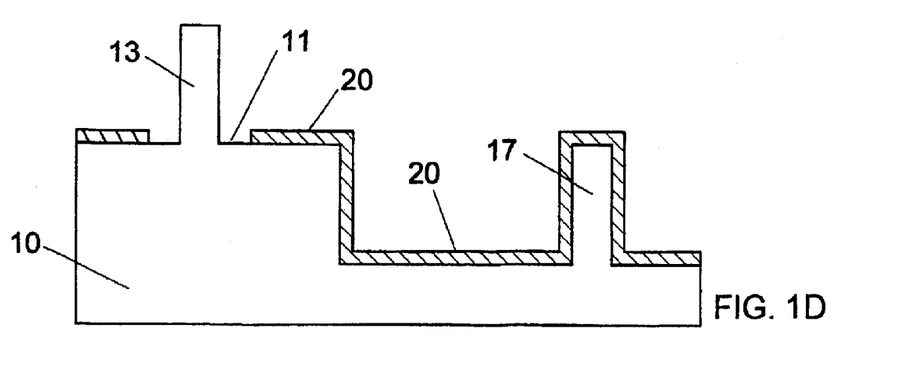

Next, a first conductive layer 20 having a desired circuit pattern is formed on the substrate 10. For example, the first conductive layer 20 can be obtained by forming a copper film 20a on the entire top surface of the substrate 10 by spattering or CVD (Chemical Vapor Deposition), as shown in FIG. 1B, removing a required region of the copper film 20a by use of a laser beam to obtain a copper-film pattern 20b on the substrate 10 (FIG. 1C), and electroplating copper on the copper-film pattern 20b (FIG. 1D). For example, it is preferred the copper film 20a has a thickness of 0.1 to 0.5 μm. There are advantages that the copper-film pattern can be easily formed by laser patterning, and the subsequent electroplating is facilitated. In this embodiment, the copper film 20a on the first projection 13 and a part of the copper film 20a on the first surface 11 are removed to obtain the copper-film pattern 20b.

Figure 2A:
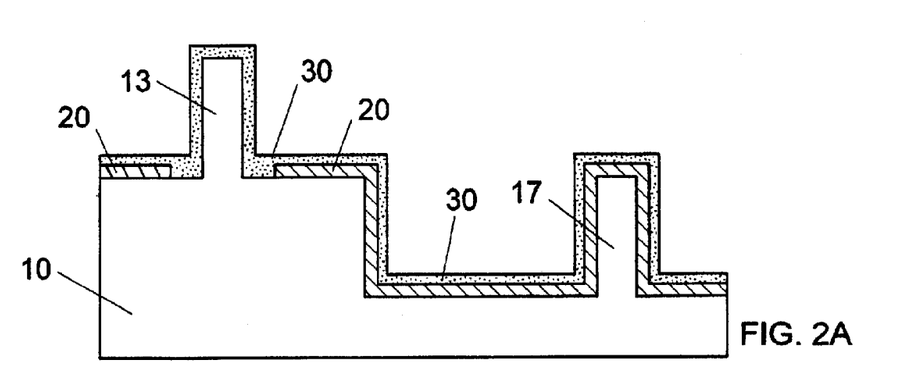
FIGS. 2A to 2D are cross-sectional views illustrating the method of manufacturing the multilayer circuit board continued from FIG. 1D.
Figure 2B:
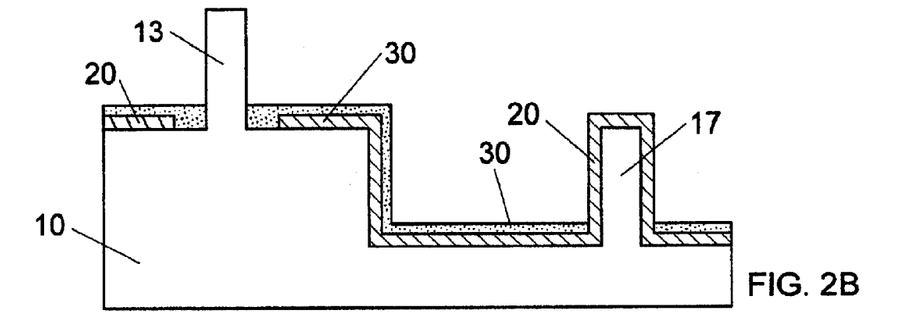

Next, as shown in FIG. 2A, a first insulation layer 30 is formed on the entire top surface of the substrate of FIG. 1D. The first insulation layer 30 can be formed by means of film formation, for example, a method of applying an insulation material on the substrate 10 of FIG. 1D with the first conductive layer 20, a method of adhering an insulation film on the substrate 10, or a deposition polymerization method. Next, required regions of the first insulation layer 30 are removed. In this embodiment, as shown in FIG. 2B, the insulation material of the first insulation layer 30 is removed from the first projection 13 and the second projection 17. The step of removing the insulation material can be carried out by use of a laser beam or a focused ion beam.

Figure 2C:
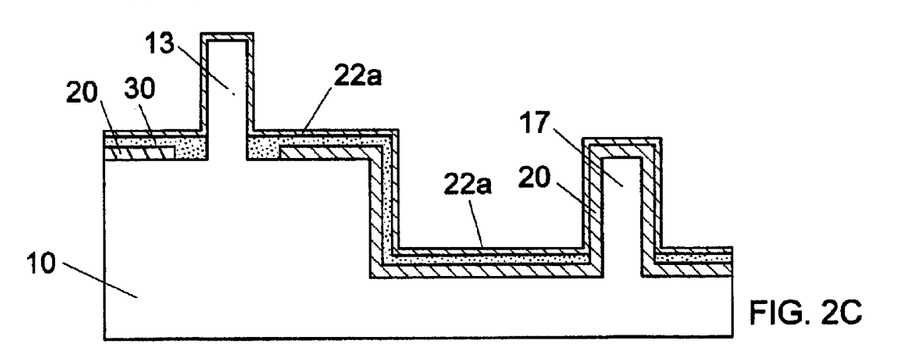
Figure 2D:
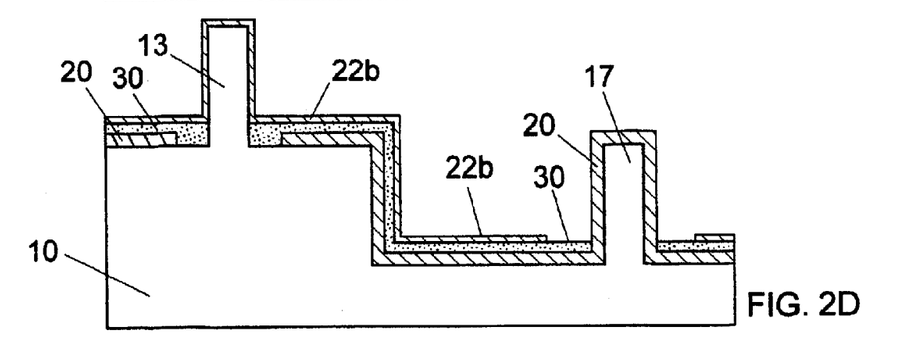
Figure 3A:
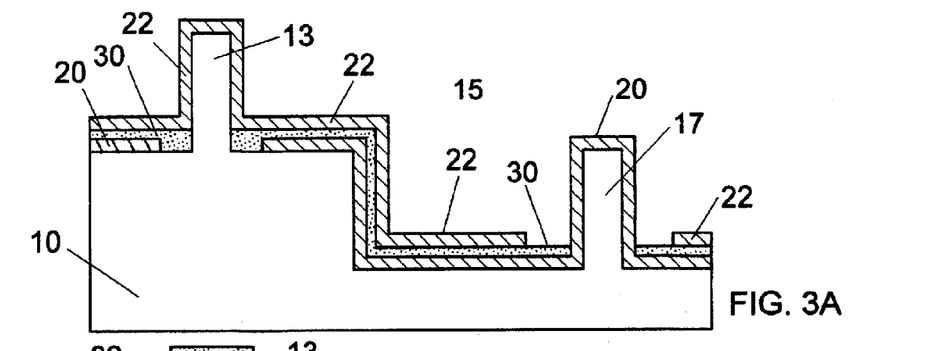
FIGS. 3A to 3D are cross-sectional views illustrating the method of manufacturing the multilayer circuit board continued from FIG. 2D.

Next, a second conductive layer 22 having a desired circuit pattern is formed. The second conductive layer 22 can be obtained by forming a copper film 22a on the entire top surface of the substrate of FIG. 2B by spattering or CVD (FIG. 2C), removing a required region of the copper film 22a by use of a laser beam to obtain a copper-film pattern 22b (FIG. 2D), and electroplating copper on the copper-film pattern 22b (FIG. 3A). In this embodiment, a part of the copper film 22a is removed from the second projection 17 to form the copper-film pattern 22b.

Figure 3B:
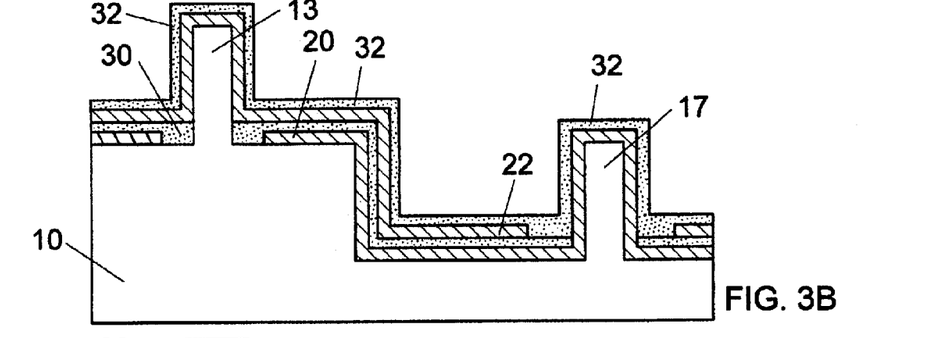
Figure 3C:
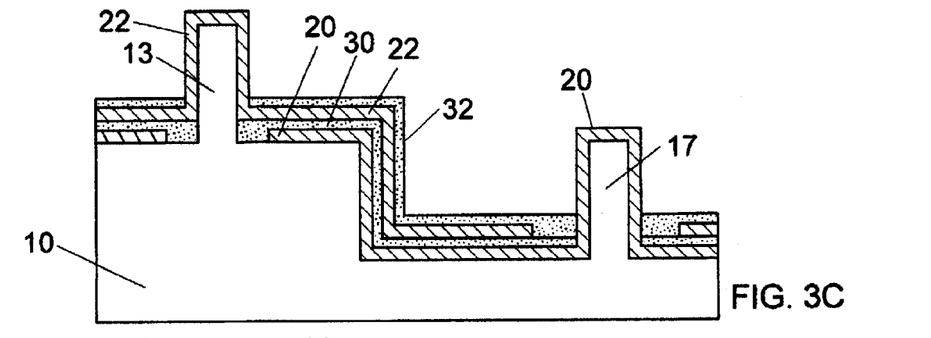

Then, a second insulation layer 32 is formed on the entire top surface of the substrate of FIG. 3A, as shown in FIG. 3B. The above-described method of forming the first insulation layer 30 is available to form the second insulation layer 32. Next, required regions of the second insulation layer 32 are removed. In this embodiment, as shown in FIG. 3C, the insulation material of the second insulation layer 32 is removed from the first projection 13 and the second projection 17.

Figure 3D:
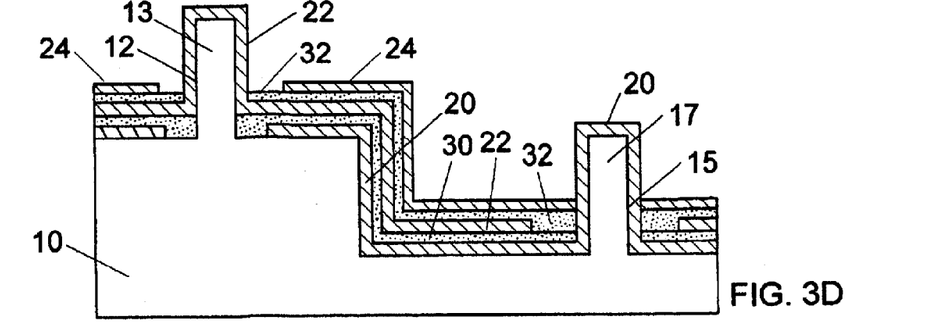

In addition, as shown in FIG. 3D, a third conductive layer 24 having a desired circuit pattern is formed. The above-described method of forming the first or second conductive layer (20, 22) is available to form the third conductive layer 24. In this embodiment, at both sides of the second projection 17 (FIG. 3D), an end of the third conductive layer 24 makes contact with the first conductive layer 20 on the side surface 15 of the second projection 17. Therefore, the first conductive layer 20 on the side surface 15 of the second projection 17 provides a layer-to-layer connection between the first conductive layer and third conductive layers (20, 24) of the multilayer circuit.

Figure 4A:
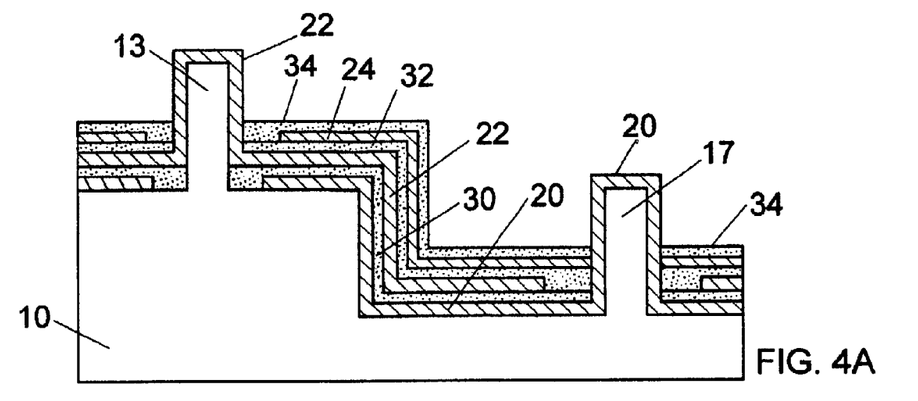
FIGS. 4A to 4C are cross-sectional views illustrating the method of manufacturing the multilayer circuit board continued from FIG. 3D.

Next, a third insulation layer 34 is formed on the entire top surface of the substrate of FIG. 3D. Subsequently, required regions of the third insulation layer 34 are removed. In this embodiment, as shown in FIG. 4A, the insulation material of the third insulation layer 34 is removed from the first and second projections (13, 17) to expose the second conductive layer 22 and the first conductive layer 20, respectively.

Figure 4B:
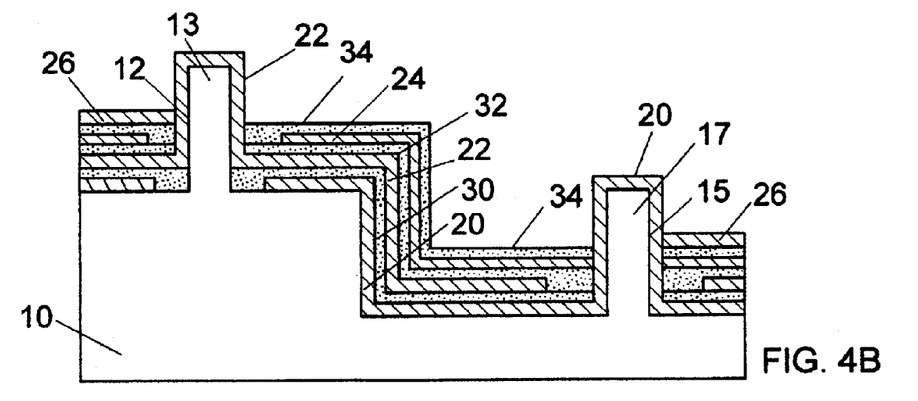

Next, a fourth conductive layer 26 having a desired circuit pattern is formed. The above-described method of forming the first or second conductive layer (20, 22) is available to form the fourth conductive layer 26. In this embodiment, at the left side of the first projection 13 (FIG. 4B), an end of the fourth conductive layer 26 makes contact with the second conductive layer 22 on the first projection 13. Therefore, the second conductive layer 22 on the side surface 12 of the first projection 13 provides a layer-to-layer connection between the second and fourth conductive layers (22, 26) of the multilayer circuit. In addition, at the right side of the second projection 17 (FIG. 4B), an end of the fourth conductive layer 26 makes contact with the first conductive layer 20 on the second projection 17. Therefore, the first conductive layer 20 on the side surface 15 of the second projection 17 provides a layer-to-layer connection between the first, third and fourth conductive layers (20, 24, 26) of the multilayer circuit, as shown in FIG. 4C.

Figure 4C:
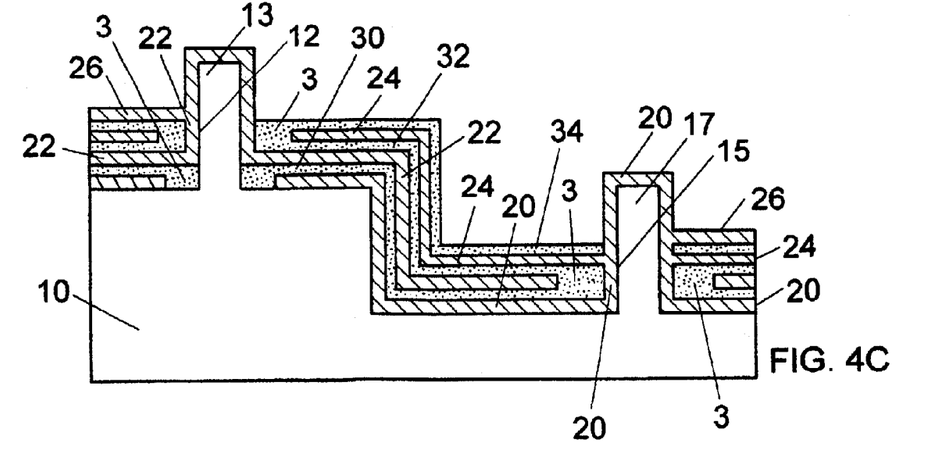

Thus, the multilayer circuit board of this embodiment is produced such that each of the conductive layers (20, 22, 24) is spaced from the adjacent conductive layer by a multilayer insulating structure 3, as shown in FIG. 4C. That is, in this embodiment, the multilayer insulating structure 3 is composed of the first insulation layer 30, the second insulation layer 32, which is connected to a part of the first insulation layer, and the third insulation layer 34, which is connected to a part of the second insulation layer.

By the way, in the present invention, since each of the conductive layers (20, 22, 24, 26) and the insulation layers (30, 32, 34) is formed by means of film formation, it is possible to provide the multilayer circuit having a reduced thickness. For example, it is preferred that the outermost conductive layer 26 of the multilayer circuit has a thickness of 10 to 30 μm, which can be formed by performing electro-plating of copper, gold or nickel on the thin copper film. It is preferred that each of the inner conductive layers (20, 22, 24) of the multilayer circuit has a smaller thickness than the outermost conductive layer 26. For example, when amounts of electric current passing the inner conductive layer are small, and the inner conductive layer is allowed to have a relatively large resistance, it is preferred that each of the inner conductive layers has a thickness of 0.5 to 10 μm. Therefore, if necessary, the inner conductive layer may be formed by only a thin copper film without the subsequent electroplating.

On the other hand, the insulation layer (30, 32, 34) can be formed by use of epoxy resins or polyimide resins. It is preferred that of the each of the insulation layers (30, 32, 34) has a thickness of 50 μm or less, which means a thickness of the insulation layer formed on the circuit pattern of the conductive layer, but does not mean the thickness of the insulation layer filled in concaves that are formed by removing required regions of the conductive layer to obtain the circuit pattern of the conductive layer. In addition, when the multilayer circuit having a reduced thickness is needed, it is preferred that each of the insulation layers has a thickness of 5 to 20 μm to avoid the occurrence of insulation failures such as pinholes.

In the present invention, since the multilayer circuit is formed by alternately laminating the conductive layer and the insulation layer obtained by means of film formation, the multilayer circuit board of a reduced thickness can be manufactured, as compared with the case of stacking a plurality of resin-molded circuit boards having conductive patterns, as disclosed in Japanese Patent Early Publication No. 7-170077. In addition, since the conductive layer formed on the side surface of the projection of the substrate is used for the layer-to-layer connection of the multilayer circuit, there is an advantage that the formation of the layer-to-layer connection between the conductive layers can be carried out simultaneously with the formation of the conductive layer of the multilayer circuit. Moreover, there is no worry about problems peculiar to the formation of through-holes or via-holes. Therefore, even when high-density wiring of the layer-to-layer connections is needed, it is possible to provide a high degree of flexibility in circuit design without deteriorating the reliability of the layer-to-layer connections.

In this embodiment, the multilayer circuit is composed of four conductive layers (20, 22, 24, 26) and three insulation layers (30, 32, 34). However, the numbers of the conductive layers and the insulation layers in the multilayer circuit, the number of the projections, and the position and size of the respective projection can be optionally determined according to circuit designs to be needed in the multilayer circuit.

In the present invention, it is particularly important to form the insulation layer (30, 32, 34) by means of film formation to obtain the reduced thickness of the multilayer circuit. As described above, the insulation layer can be formed by deposition polymerization or plasma polymerization. Alternatively, the insulation layer may be obtained by forming a film of an insulating resin having photocurability, and curing the film under light irradiation such as ultraviolet. In the later case, since only desired regions of the photocurable resin film can be exposed to the light to obtain a cured region in the resin film, and the uncured region in the resin film can be readily removed by cleaning, it is possible to efficiently form the insulation layer.

To omit the step of removing the required regions of the insulation layer, it is preferred to form the insulation layer on only the surfaces other than the projections. For example, an insulation film may be formed by thermo-compression bonding an insulating resin sheet having apertures at positions corresponding to the projections on the substrate. In the case of forming the insulation layer on the conductive layer on the substrate, an insulation resin film may be formed on the conductive layer by means of electro-deposition.

Figure 5:
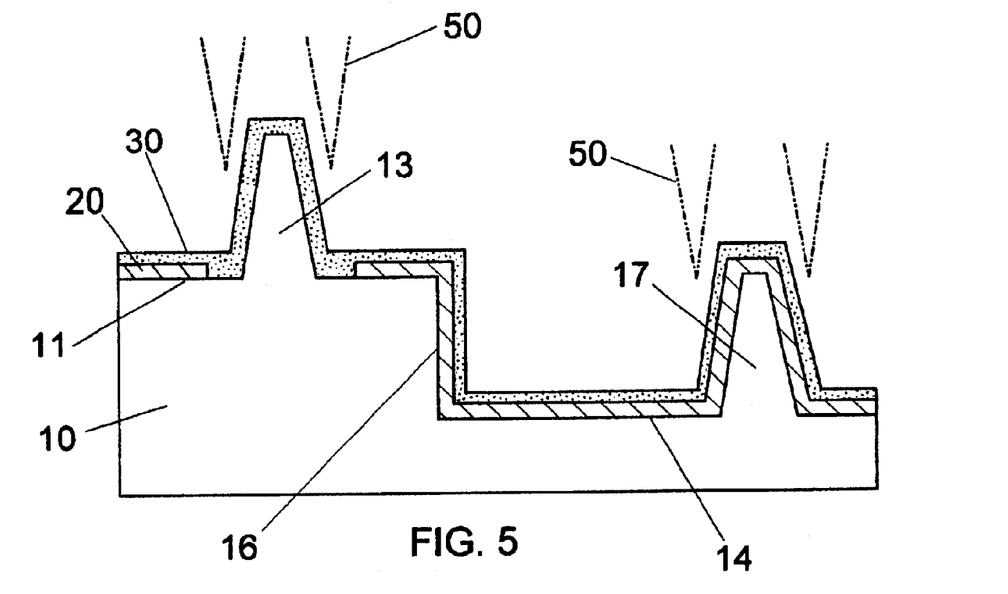
FIG. 5 is a cross-sectional view illustrating a step of forming an insulation layer by use of a laser beam according to a modification of the first embodiment.

As described above, the shape of the projection can be optionally determined. For example, as shown in FIG. 5, it is preferred that each of the first and second projections (13, 17) has a tapered tip. In this case, since the side surface of the projection is an inclined surface by an obtuse angle relative to the horizontal surface of the substrate, there is an advantage that the irradiation angle of a laser beam 50 or a focused ion beam can be easily set. In addition, when removing the insulation film on the projection by a plasma etching using, for example, oxygen plasma, the electric-field strength increases at the vicinity of the tapered tip, and oxygen ions in the plasma are concentrated onto the projection. As a result, a higher etching rate of the insulation material is obtained on the projection than the flat-surface portion. Therefore, by exposing the insulation film on the projection to the plasma, it is possible to readily remove the insulation film from the projection.

Before the formation of the insulation film, it is preferred to perform a surface-modification treatment for giving water repellency or oil repellency to the projection surface, for example, fluoridization treatment using $CF_4$ ions. In this case, the step of removing the insulation layer from the projection can be further enhanced.

With respect to the formation of the conductive layer (20, 22, 24, 26), for example, the conductive layer may be formed on only desired regions of the substrate by spraying aerosol-like copper fine particles, or using a laser CVD. In these cases, it is possible to omit the step of etching the conductive film to obtain the required circuit pattern.

Second Embodiment

A multilayer circuit board according to a second embodiment of the present invention is explained in detail below.

Figure 6:
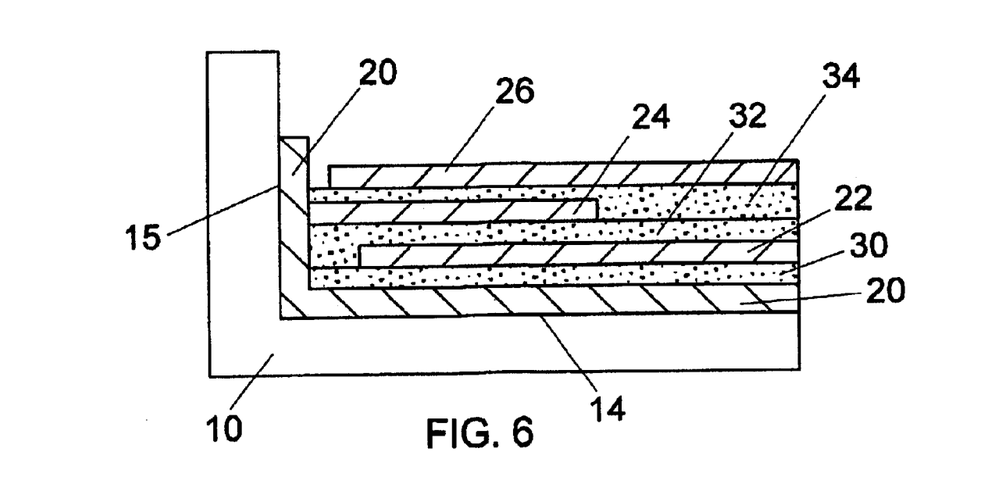
FIG. 6 is a cross-sectional view of a multilayer circuit board according to a second embodiment of the present invention.

FIG. 6 shows a cross-sectional view of the multilayer circuit board of the second embodiment. This multilayer circuit board comprises a substrate 10 having a first surface 14 that is a horizontal surface and a second surface 15 projecting in a substantially vertical direction from one side of the first surface, a multilayer circuit formed on the substrate 10 which is formed by alternately laminating a conductive layer (20, 22, 24, 26) and an insulation layer (30, 32, 34) on a required number of times. The conductive layer 20 also extends on the second surface 15, which is used to make a layer-to-layer connection between the conductive layers (20, 24).

Figure 7A:
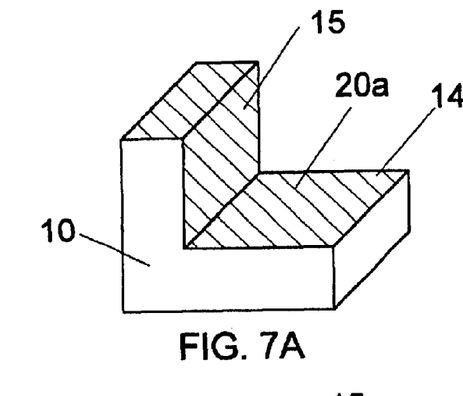
FIGS. 7A to 7F are perspective views illustrating a method of manufacturing the multilayer circuit board of the second embodiment.
Figure 7B:
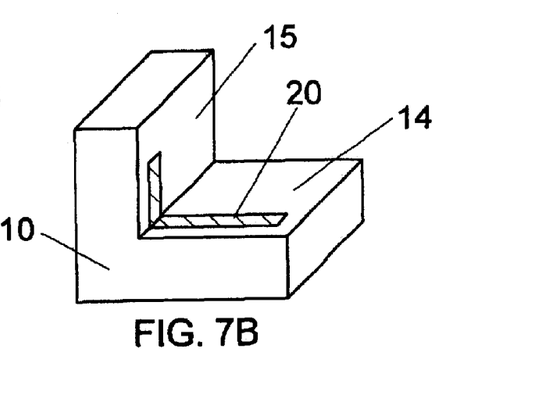

The multilayer circuit board described above can be manufactured by the following method. First, as shown in FIG. 7A, a copper film 20a is formed on the entire first and second surfaces (14, 15) of the substrate 10 by means of spattering or CVD. A required region of the copper film 20a is removed by laser etching to obtain a copper film pattern extending on the first and second surfaces. Then, electroplating is performed on the copper film pattern to obtain the conductive layer 20, as shown in FIG. 7B. In the case of using the copper spattering, the step of removing the required region of the copper film 20a can be omitted by using a mask having a mask pattern corresponding to the copper film pattern.

Figure 7C:
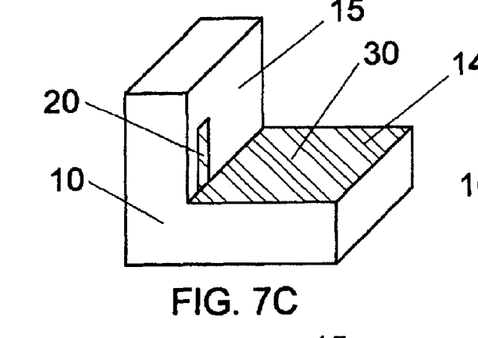
Figure 7D:
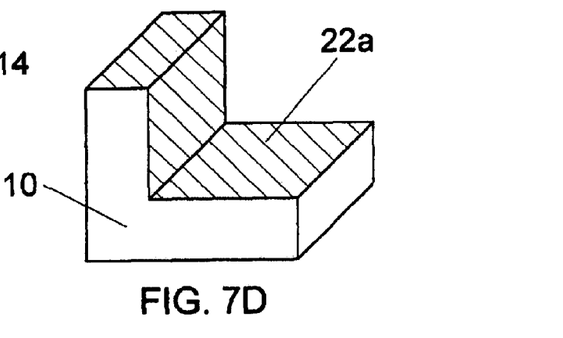
Figure 7E:
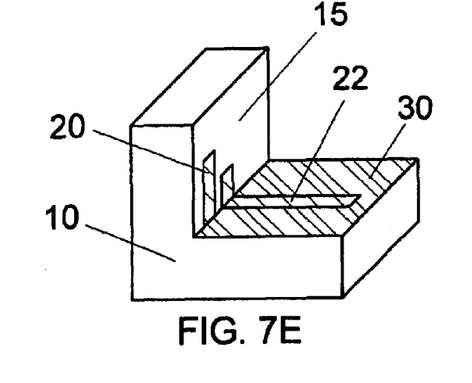

After an insulation layer 30 is formed on the entire first surface 14, as shown in FIG. 7C, a copper film 22a is formed on the insulation layer 30 and the entire second surface 15 of the substrate 10, as shown in FIG. 7D. Then, a required region of the copper film 22a is removed to obtain a copper film pattern, and electroplating is performed on the copper film pattern. As a result, a second conductive layer 22 extending on the second surface 15 as well as the insulation layer 30 is obtained, as shown in FIG. 7E. Each of the conductive layers 20, 22 is composed of a vertical portion used to make the layer-to-layer connection, and a horizontal portion used to make the circuit-pattern layer of the multilayer circuit.

Figure 7F:
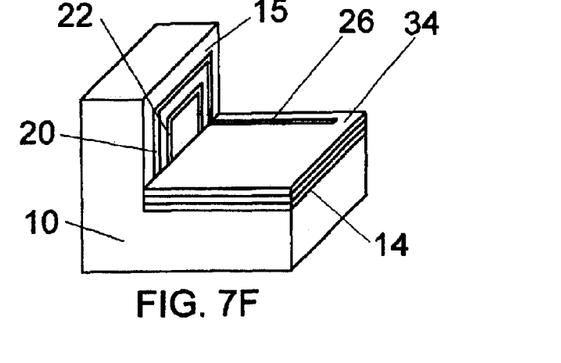

By repeating the above procedure, for example, the multilayer circuit shown in FIG. 7F can be obtained on the substrate 10. In the multilayer circuit board of FIG. 7F, a first layer-to-layer connection between the conductive layers (20, 26) is provided through a vertical portion of the conductive layer 20 on the second surface 15, and a second layer-to-layer connection between the conductive layers (22, 24) is provided through a vertical portion of the conductive layer 22 on the second surface 15.

Figure 8:
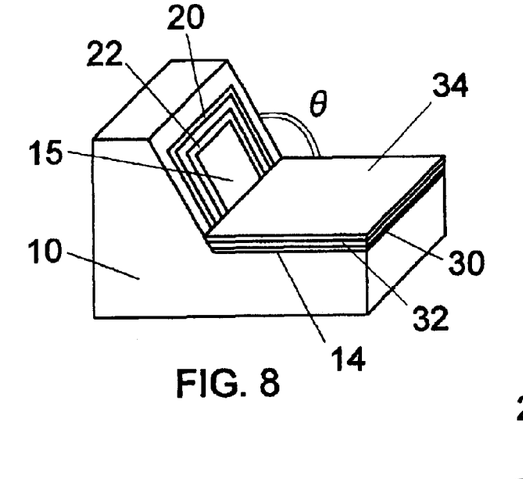
FIG. 8 is a perspective view of a multilayer circuit board according a first modification of the second embodiment.

As a first modification of the second embodiment, it is preferred that the second surface 15 is an inclined surface by an obtuse angle θ relative to the first surface 14, as shown in FIG. 8. In this case, there is an advantage that the circuit-pattern forming step with use of a laser beam can be readily performed with precision on the second surface 15. For example, when the obtuse angle is 120 degrees or more, the circuit-pattern forming step can be readily performed by irradiating the laser beam to the second surface 15 from above, i.e., a direction vertical to the first surface 14. In other words, it is possible to efficiently form the circuit patterns for layer-to-layer connections on the second surface 15 by laser patterning without changing the irradiation angle of the laser beam used to form the multilayer circuit on the first surface 14.

Figure 9:
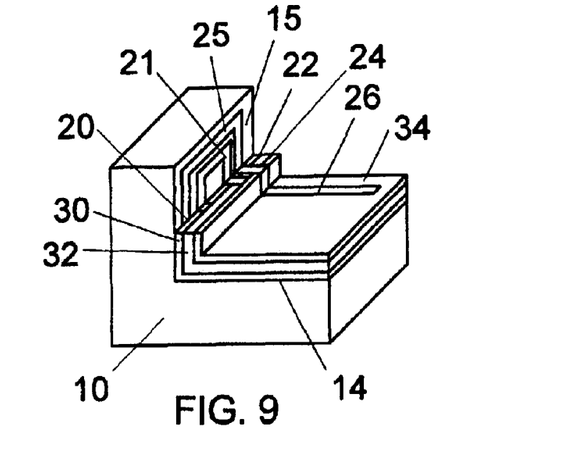
FIG. 9 is a perspective view of a multilayer circuit board according a second modification of the second embodiment.

As a second modification of the second embodiment, each of the insulation layers (30, 32, 34) may be formed to extend on a part of the second surface 15 as well as the first surface 14, as shown in FIG. 9. That is, each of the insulation layers is composed of a vertical portion extending parallel to the second surface 15, and a horizontal portion extending parallel to the first surface 14. In this case, a layer-to-layer connection between desired conductive layers is made through a circuit pattern (21, 25) for layer-to-layer connection on the second surface 15. That is, the layer-to-layer connection between the conductive layers (20, 26) is made through the circuit pattern 25 on the second surface 15, and another layer-to-layer connection between the conductive layers (22, 24) is made through the circuit pattern 21 on the second surface 15.

Figure 10A:
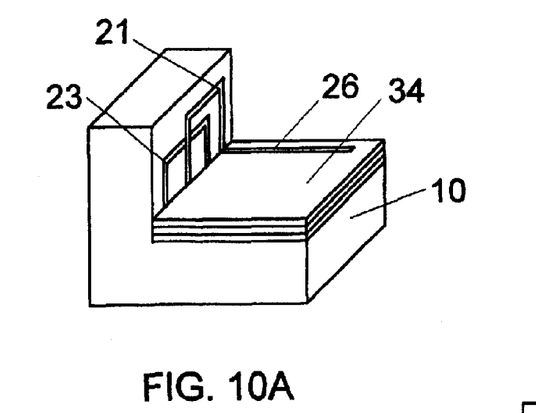
FIG. 10A is a perspective view of a multilayer circuit board according a third modification of the second embodiment.
Figure 10B:
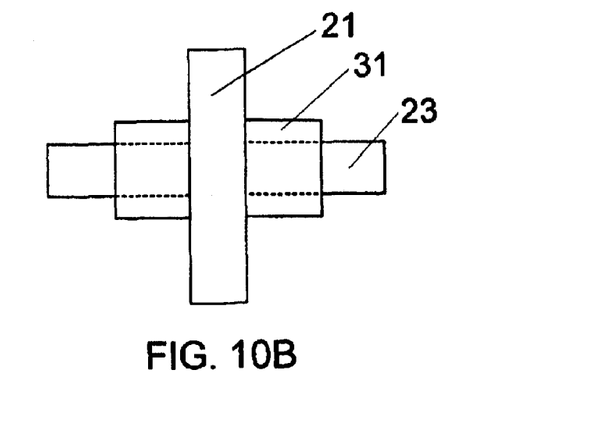
FIG. 10B shows an intersection of circuit patterns for layer-to-layer connection.

In a third modification of the second embodiment, as shown in FIGS. 10A and 10B, when two circuit patterns (21, 23) for layer-to-layer connection cross each other, it is preferred that one of the circuit patterns is separated from the other one by an additional insulation film 31 formed at the point of intersection. This improves the reliability in insulation between the partially overlapped layer-to-layer connections.

Figure 11A:
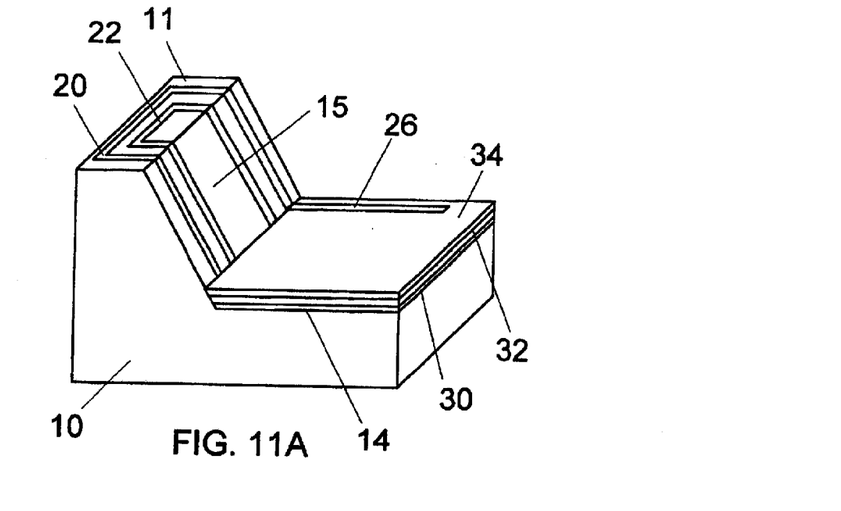
FIG. 11A is a perspective view of a multilayer circuit board according a fourth modification of the second embodiment.

As a fourth modification of the second embodiment, when forming a plurality of circuit patterns (20, 22) for layer-to-layer connection on a substrate 10 that is composed of a first surface 14, third surface 11 extending at a different height from the first surface, and a second surface 15 that is an inclined surface extending therebetween, as shown in FIG. 11A, it is preferred that the circuit patterns (20, 22) for layer-to-layer connections are formed to extend on the third surface 11 through the second surface 15. In this case, to form the circuit patterns (20, 22) on the second surface 15, the laser beam is merely scanned in only the longitudinal direction on the inclined surface 15. In other words, the scanning of the laser beam in the lateral direction on the inclined surface 15 is not necessary. Thus, the laser-patterning operation on the inclined surface is easy.

Figure 11B:
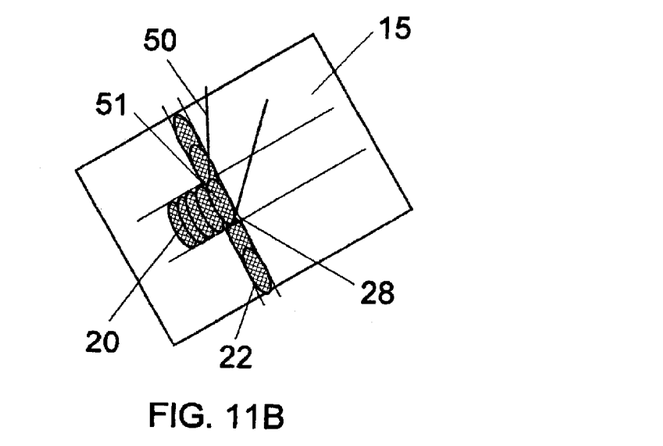
FIG. 11B is a schematic view showing the formation of a circuit pattern on an inclined surface by laser patterning.

In addition, as shown in FIG. 11B, when an intersection 28 of the circuit patterns (20, 22) for layer-to-layer connection is formed on the inclined surface 15 by means of laser patterning, it may become difficult to form the circuit patterns at high densities because the laser spot 51 on the inclined surface 15 is an ellipse shape. In such a case, by forming the intersection 28 on the third surface 11 of the substrate 10 of FIG. 11A, it is possible to accurately form the circuit patterns for layer-to-layer connection at high densities by use of the laser beam 50.

Figure 12:
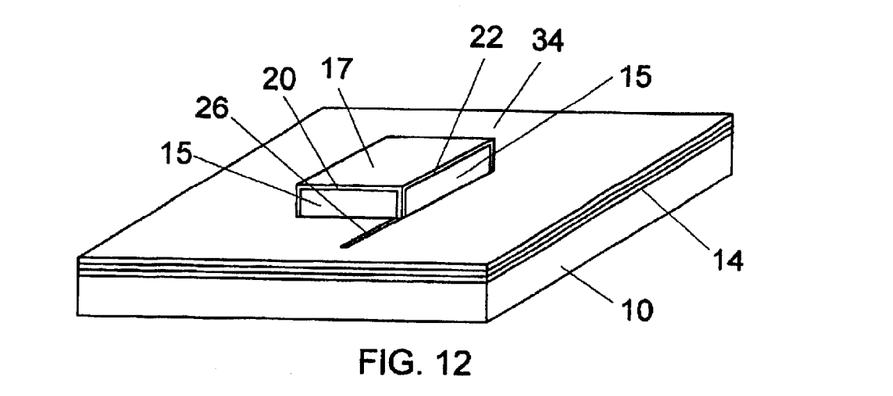
FIG. 12 is a perspective view of a multilayer circuit board according to a fifth modification of the second embodiment.

As a fifth modification of this embodiment, when forming a circuit pattern(s) for layer-to-layer connection on each of side surfaces 15 of a single projection 17 on a substrate 10, as shown in FIG. 12, it is possible to reduce the total number of projections to be formed on the substrate 10, and to save space required for the formation of the layer-to-layer connections. Moreover, a top surface of the projection 17 can be used to make electrical connections between circuit patterns on the different side surfaces. Thus, by concentrating a lot of circuit patterns for layer-to-layer connections on one projection 17, it is possible to further facilitate high-density wiring and achieve space saving.

For the purpose of achieving the high-density wiring, high production efficiency of the multilayer circuit board, and easiness of laser patterning with accuracy, an optimum combination of the modifications shown in FIGS. 8 to 12 can be used.

Third Embodiment

A multilayer circuit board according to a third embodiment of the present invention is explained in detail below.

Figure 13A:
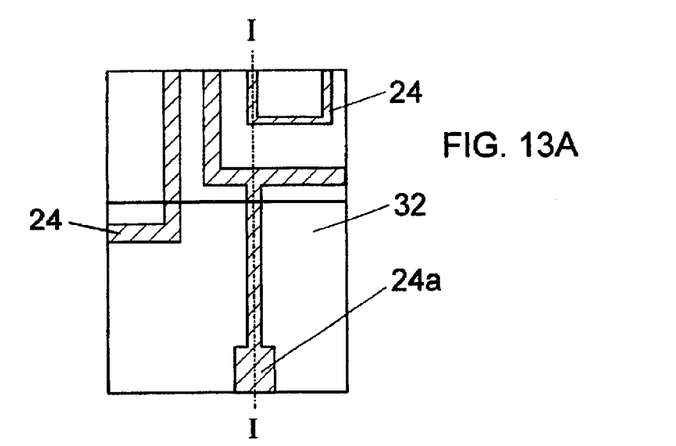
FIG. 13A shows a circuit pattern of a conductive layer of a multilayer circuit board according to a third embodiment of the present invention.
Figure 13B:
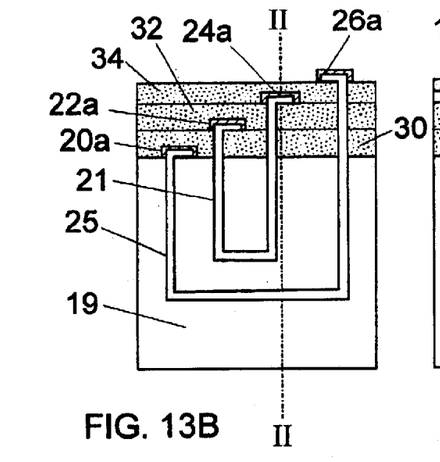
FIGS. 13B and 13C are side and cross-sectional views of the multilayer circuit board, respectively.
Figure 13C:
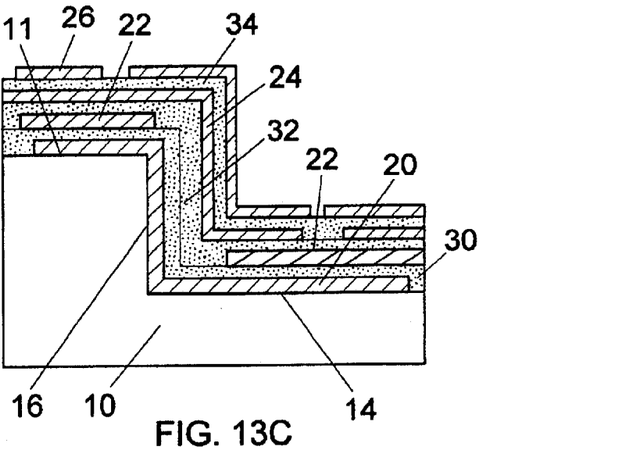

As shown in FIGS. 13A to 13C, this multilayer circuit board comprises a substrate 10 having a first surface 11 that is a horizontal surface, second surface 14 that is a horizontal surface extending at a different level from the first surface, and a third surface 16 extending in a substantially vertical direction between the first surface 11 and the second surface 14, and a multilayer circuit formed on the substrate 10, which is manufactured by alternately laminating a conductive layer (20, 22, 24, 26) and an insulation layer (30, 32, 34) on a required number of times. Each of the insulation layers (30, 32, 34) and the conductive layers (20, 22, 24, 26) can be formed by the same method as explained in the first embodiment. This embodiment is characterized in that a layer-to-layer connection of the multilayer circuit is made through a circuit pattern (21, 25) for layer-to-layer connection formed on a cutting surface (side surface) 19 of the substrate 10.

The circuit pattern (21, 25) for layer-to-layer connection can be formed by the following procedure. That is, after the formation of the multilayer circuit on the substrate is finished, the substrate 10 with the multilayer circuit is cut in a substantially vertical direction such that a cutting surface of the multilayer circuit is flush with the cutting surface 19 of the substrate 10. As a result, connection ends (20a, 22a, 24a, 26a) of the conductive layers (20, 22, 24, 26) are exposed on the cutting surface 19. Circuit patterns (21, 25) for layer-to-layer connection are connected to those connection ends. As an example, a third conductive layer 24 having a circuit pattern and the connection end 24a on a second insulation layer 32 is shown in FIG. 13A. FIG. 13C is a cross-sectional view taken on the line I—I of FIG. 13A and the line II—II of FIG. 13B. In this embodiment, one of the circuit patterns 25 extends from the connection end 20a to the connection end 26a through the cutting surface (side surface) 19 of the substrate 10, and the other one of the circuit patterns 21 extends from the connection end 22a to the connection end 24a through the cutting surface (side surface) 19 of the substrate 10. To obtain these circuit patterns on the cutting surface 19, the above-described method of forming the conductive layer of the multilayer circuit is available.

Figure 14:
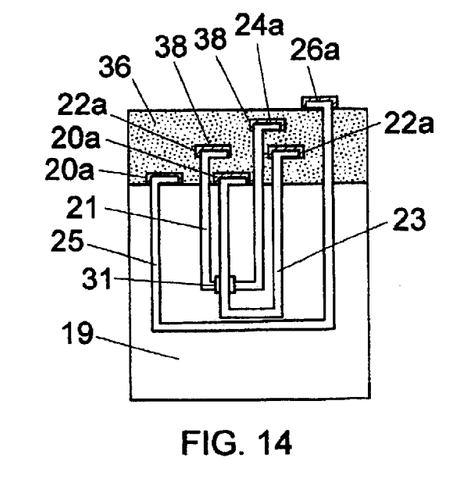
FIG. 14 is a side view of a multilayer circuit board according to a first modification of the third embodiment.

As a first modification of the third embodiment, when parts of the conductive layers other than the connection ends (20a, 22a, 24a, 26a) are exposed outside, it is preferred to form an insulation film 36 having windows 38 for the formation of layer-to-layer connection in predetermined positions on the cutting surface of the multilayer circuit, as shown in FIG. 14, and connect the connection ends with the circuit patterns (21, 23, 25) through these windows 38. In this case, it is possible to avoid undesired connections between the circuit patterns (21, 23, 25) and the exposed parts of the conductive layer. In this figure, the numeral 31 designates an additional insulation film formed at the point of intersection of the circuit patterns (21, 23) to make electrical insulation therebetween.

Figure 15:
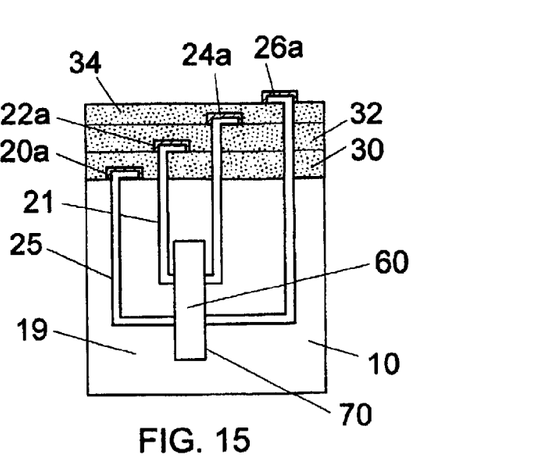
FIG. 15 is a side view of a multilayer circuit board according to a second modification of the third embodiment.

As a second modification of the third embodiment, a device-mounting portion 60, on which an electronic device (s) 70 such as IC chips can be mounted, may be formed on cutting surface 19 of the substrate 10, as shown in FIG. 15. In this case, the circuit patterns (21, 25) for layer-to-layer connection extend through the electronic device 70 mounted on this device-mounting portion 60.

Figure 16A:
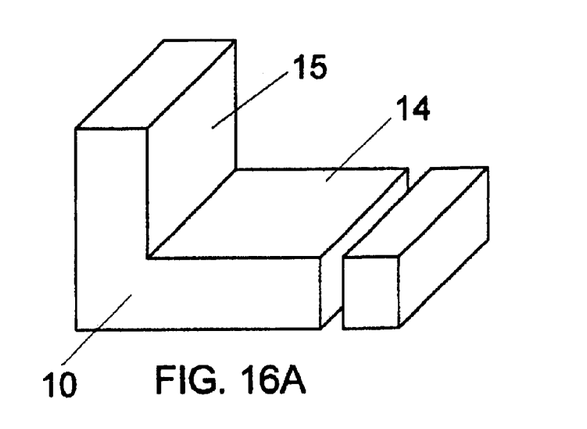
FIGS. 16A to 16C are perspective views illustrating cutting operations for substrates.
Figures 16B, 16C:
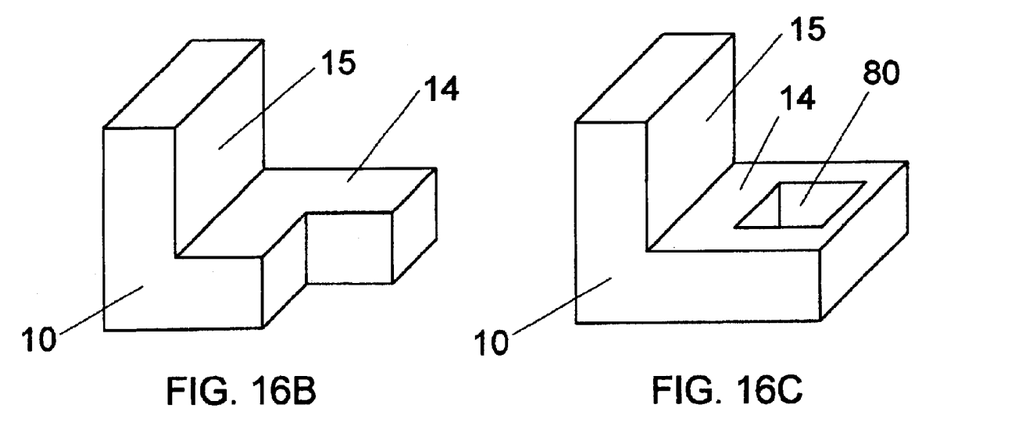

By the way, the cutting operation for the multilayer circuit board is not limited to the above embodiment. For example, the cutting operation may be performed at a side of the second surface 14, as shown in FIG. 16A, or at only a corner of the second surface 14, as shown in FIG. 16B, or such that a through hole 80 having a required shape is formed in the second surface 14, as shown in FIG. 16C.

Figure 17:
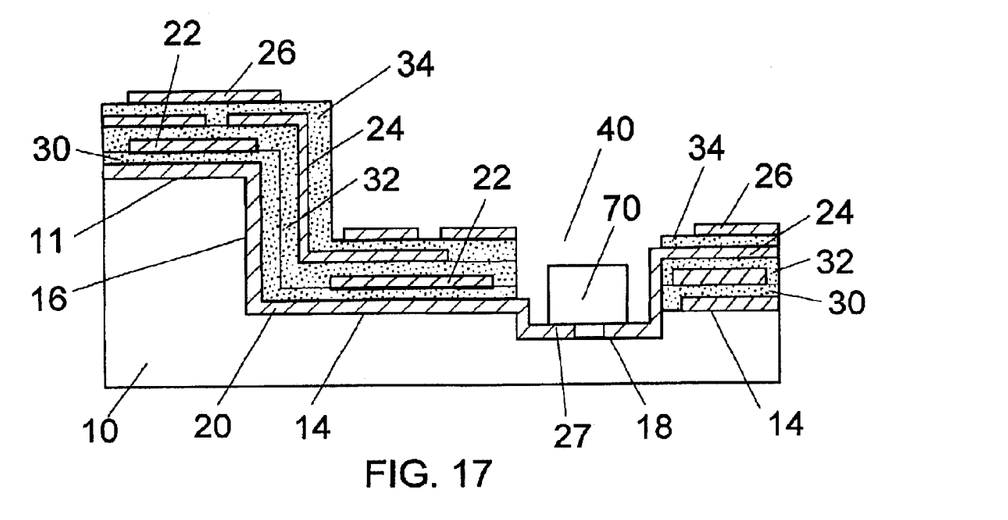
FIG. 17 is a cross-sectional view of a multilayer circuit board of a third modification of the third embodiment.

As a third modification of the third embodiment, it is also preferred that an aperture 40 having a depth of reaching the second surface 14 of the substrate 10 is formed in the multilayer circuit, and a part of the substrate 10 is removed through the aperture 40 to form a concave 18 in the second surface 14, as shown in FIG. 17. In this embodiment, an electronic device 70 such as IC chips can be mounted in the concave 18, and a circuit pattern 27 for layer-to-layer connection extends between the conductive layers (20, 24) through the electronic device 70 mounted in the concave 18. The concave 18 having the electronic device 70 and the aperture 40 may be filled with a sealing resin.

Figure 18:
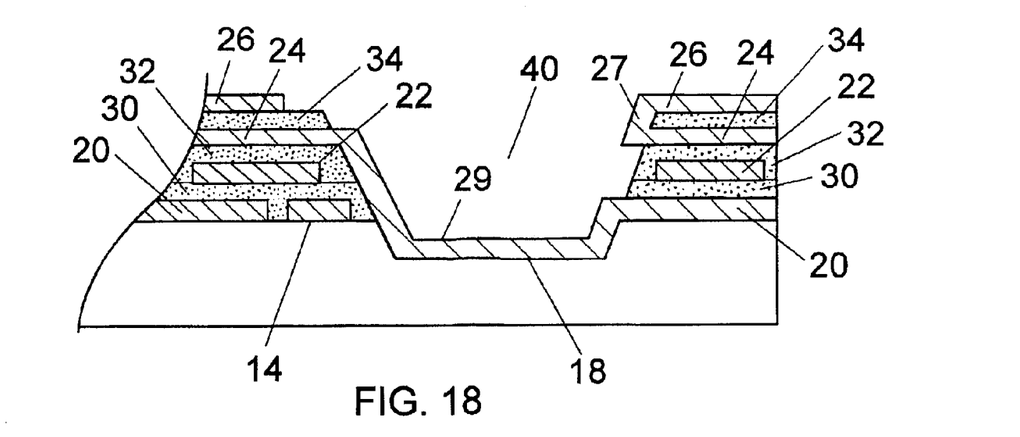
FIG. 18 is a partially cross-sectional view of a multilayer circuit board of a fourth modification of the third embodiment.

In a fourth modification of the third embodiment, an aperture 40 having the depth of reaching the second surface 14 of the substrate 10 is formed in the multilayer circuit, and a part of the substrate 10 is removed through the aperture 40 to obtain the concave 18 in the second surface 14. As shown in FIG. 18, this modification is characterized in that exposed cutting surfaces of the multilayer circuit in the aperture 40 are inclined surfaces to improve the easiness of laser patterning. In this modification, no electronic device is mounted in the concave 18, but a desired device can be mounted therein, if necessary. In FIG. 18, a layer-to-layer connection between the conductive layers (24, 26) is made by a circuit pattern 27 formed on the exposed cutting surface of the multilayer circuit. On the other hand, another layer-to-layer connection between the conductive layers (24, 20) is made through a circuit pattern 29 formed on a bottom of the concave 18. Since the exposed cutting surface of the multilayer circuit is the inclined surface, these circuit patterns can be readily formed with precision by laser patterning.

In the aperture 40 shown in FIG. 17 or 18, if necessary, it is possible to adopt a desired combination of forming the layer-to-layer connection through the exposed cutting surface of the multilayer circuit board, forming the layer-to-layer connection through the bottom of the concave 18, mounting a desired electronic device in the concave, and filling the sealing resin in the aperture.

In the present embodiment, after the formation of the multilayer circuit is finished, the multilayer circuit is cut. However, if necessary, the cutting operation may be performed at a desired timing during the formation of the multilayer circuit. In this case, it is possible to carry out the formation of the conductive layer of the multilayer circuit simultaneously with the formation of the circuit pattern for layer-to-layer connection.

In the multilayer circuit board of the present invention, each of the conductive layers and the insulation layers of the multilayer circuit is formed by means of film formation to achieve high integration of the multilayer circuit board. When a plurality of layer-to-layer connections are formed on only the exposed cutting surface of the multilayer circuit having the reduced thickness, there is a fear that the reliability of the layer-to-layer connection deteriorates. However, in this embodiment, since the circuit pattern for layer-to-layer connection is formed so as to extend between the desired conductive layers of the multilayer circuit through the exposed cutting surface of the substrate, it is possible to avoid such a deterioration of the reliability of the layer-to-layer connection. In addition, when forming the circuit pattern for layer-to-layer connection on the exposed cutting surface of the substrate, there are advantages that the method of forming the conductive layer of the multilayer circuit can be also applied to form the circuit pattern for layer-to-layer connection, and problems peculiar to the formation of through-holes or via-holes can be avoided. Therefore, even when high-density wiring of the layer-to-layer connections is needed, it is possible to provide a high degree of flexibility in circuit design, without deteriorating the reliability of the layer-to-layer connections.

What is claimed is:

1. A multilayer circuit board, comprising:

a substrate having a first surface and a second surface extending from an end of the first surface at a required angle relative to the first surface;

a multilayer circuit formed on the first surface of said substrate and composed of a plurality of circuit layers, each of which is provided with a conductive layer having a required circuit pattern and an insulation layer formed on said conductive layer by film formation;

a second conductive layer formed on the second surface of said substrate, by which said conductive layer of one of said circuit layers is electrically connected to said conductive layer of another one of said circuit layers, wherein the second surface of said substrate includes a side surface of a projection on the first surface, wherein the first surface is a higher level surface than a level surface of the second surface of said substrate, and the second surface further includes a side surface of said substrate, and wherein the required angle between the first and second surfaces is an obtuse angle.

2. The multilayer circuit board set forth in claim 1, wherein said multilayer circuit has an aperture, through which a part of the first surface is exposed, and an electronic device is mounted in a concave formed in the exposed first surface, and an electrical connection between said multilayer circuit and said electronic device is made by a third conductive layer formed on an inner surface of said concave.

3. The multilayer circuit board as set forth in claim 1, wherein said second conductive layer is a plurality of second conductive layers by each of which said conductive layer of one of said circuit layers is electrically connected to said conductive layer of another one of said circuit layers, and each of second conductive layers is separated from an adjacent second conductive layer in the thickness direction by a second insulation layer.

4. The multilayer circuit board as set forth in claim 1, wherein said conductive layer of one of said circuit layers is electrically connected to said conductive layer of another one of said circuit layers by said second conductive layer on the side surface of said projection as the second surface.

5. The multilayer circuit board as set forth in claim 1, wherein said conductive layer of one of said circuit layers is electrically connected to said conductive layer of another one of said circuit layers by said second conductive layer on the second surface extending from the end of the first surface at an obtuse angle.

6. The multilayer circuit board as set forth in claim 1, wherein said conductive layer of one of said circuit layers is electrically connected to said conductive layer of another one of said circuit layers by said second conductive layer on the side surface of said substrate as the second surface.

7. A multilayer circuit board, comprising:

a substrate having a first surface and a second surface extending from an end of the first surface at an obtuse angle relative to the first surface, the second surface further including a side surface of a projection on the first surface, a side surface of said substrate and a level surface, and the first surface being a higher level surface than the level surface of the second surface of said substrate;

a multilayer circuit formed on the first surface of said substrate and composed of a plurality of circuit layers, each of which is provided with a conductive layer having a required circuit pattern and an insulation layer formed on said conductive layer by film formation;

a second conductive layer for electrically conducting said conductive layer of one of said circuit layers to said conductive layer of another one of said circuit layers, wherein when said multilayer circuit is on the first surface, said conductive layer of one of said circuit layers is electrically connected to said conductive layer of another one of said circuit layers by said second conductive layer on the side surface of said projection as the second surface; and when said multilayer circuit is on the level surface of the second surface of said substrate, said conductive layer of one of said circuit layers is electrically connected to said conductive layer of another one of said circuit layers by said second conductive layer on the second surface extending from the end of the first surface at an obtuse angle.

8. A multilayer circuit board comprising:

a substrate having a first surface and a projection formed on the first surface, a side surface of said projection extending at an obtuse angle relative to the first surface;

a pair of multilayer circuits formed on the first surface at both sides of said projection, each of said multilayer circuits composed of a plurality of circuit layers, each of which is provided with a conductive-metal layer having a required circuit pattern and an insulation layer formed on said conductive-metal layer by film formation; and a second conductive-metal layer successively formed on side and top surfaces of said projection, wherein said conductive-metal layer of one of said circuit layers is electrically connected to said conductive layer of another one of said circuit layers by said second conductive-metal layer on the side surface of said projection, and simultaneously one of the pair of multilayer circuits is electrically connected to the other one by said second conductive-metal layer on the side and top surfaces of said projection.

9. The multilayer circuit board as set forth in claim 8, wherein said multilayer circuit has an aperture, through which a part of the first surface is exposed, and an electronic device is mounted in a concave formed in the exposed first surface, and an electrical connection between said multilayer circuit and said electronic device is made by a third conductive-metal layer formed on an inner surface of said concave.

10. The multilayer circuit board as set forth in claim 8, wherein said second conductive-metal layer is a plurality of second conductive layers to obtain plural layer-to-layer connections of said multilayer circuit, and each of second conductive-metal layers is separated from an adjacent second conductive-metal layer in the thickness direction by a second insulation layer.

11. The multilayer circuit board as set forth in claim 8, comprising a third conductive-metal layer for forming another layer-to-layer connection of said multilayer circuit, which is formed on a side surface of said substrate extending adjacent to the first surface.

* * * * *